US007595666B2

(12) United States Patent
Braswell et al.

(10) Patent No.: US 7,595,666 B2
(45) Date of Patent: Sep. 29, 2009

(54) AMPLIFIER CIRCUIT FOR DOUBLE SAMPLED ARCHITECTURES

(75) Inventors: Brandt Braswell, Chandler, AZ (US); David R. LoCascio, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/244,214

(22) Filed: Oct. 2, 2008

(65) Prior Publication Data

US 2009/0033371 A1 Feb. 5, 2009

Related U.S. Application Data

(63) Continuation of application No. 11/206,521, filed on Aug. 17, 2005, now Pat. No. 7,449,923.

(51) Int. Cl.
*H03K 17/00* (2006.01)
(52) U.S. Cl. .......................................... 327/96; 327/359
(58) Field of Classification Search ........................ None
See application file for complete search history.

(56) References Cited

U.S. PATENT DOCUMENTS

| 6,040,731 | A | 3/2000 | Chen et al. |
| 6,313,688 | B1 | 11/2001 | Lee et al. |
| 6,348,830 | B1 | 2/2002 | Rebeiz et al. |
| 6,438,365 | B1 | 8/2002 | Balteanu |
| 7,078,969 | B2 * | 7/2006 | Bhattacharjee et al. ...... 330/254 |
| 7,298,194 | B2 * | 11/2007 | Pickering et al. ............. 327/231 |
| 7,449,923 | B2 * | 11/2008 | Braswell et al. ............... 327/96 |
| 2002/0030529 | A1 | 3/2002 | Lee et al. |
| 2006/0001472 | A1 | 1/2006 | Krug et al. |

\* cited by examiner

*Primary Examiner*—Lincoln Donovan
*Assistant Examiner*—Khareem E. Almo
(74) *Attorney, Agent, or Firm*—Ingrassia, Fisher & Lorenz, P.C.

(57) ABSTRACT

A double sampled switched capacitor architecture as described herein includes an amplifier having two separate inputs corresponding to two separate amplifier sections. The amplifier uses a first differential transistor pair for the first amplifier section, a second differential transistor pair for the second amplifier section, a first tail current bias arrangement for the first differential transistor pair, and a second tail current bias arrangement for the second differential transistor pair. The tail current bias arrangements are driven by a bias switching architecture that alternately activates one tail current bias arrangement while at least partially deactivating the other tail current bias arrangement. The amplifier and bias switching architecture cooperate to eliminate gain error that would otherwise be caused by a common parasitic capacitance shared by a single amplifier section.

20 Claims, 4 Drawing Sheets

US 7,595,666 B2

AMPLIFIER CIRCUIT FOR DOUBLE SAMPLED ARCHITECTURES

CROSS-REFERENCE TO RELATED APPLICATION(S)

This application is a continuation of U.S. patent application Ser. No. 11/206,521, filed Aug. 17, 2005.

TECHNICAL FIELD

The present invention relates generally to electronic circuits. More particularly, the present invention relates to an amplifier circuit suitable for use in a double sampled architecture.

BACKGROUND

The prior art contains a number of switched-capacitor architectures suitable for use in practical applications such as filters, gain amplifiers, and analog-to-digital converters ("ADCs"). Briefly, switched-capacitor gain stages provide precisely defined gains determined by a ratio in values between capacitors, where the capacitors are used to sample an input signal. In one type of switched-capacitor gain stage, a pair of capacitors is charged in parallel across an input voltage and a ground reference. The capacitor terminals that are coupled to the ground reference are then moved to the inverting input of an operational amplifier while one of the capacitor terminals previously coupled to the input voltage is switched to the output of the amplifier and the other capacitor terminal previously coupled to the input voltage is switched to a reference voltage. When the capacitors have the same value, the output of the amplifier will then be twice the input voltage, modified by the addition or subtraction of the reference voltage (depending upon the polarity of the reference voltage). In order to increase the throughput of the gain stage, two sets of capacitor pairs may be used with one charging from the input voltage while the other is connected to the operational amplifier to produce an output value.

FIG. 1 depicts a prior art double sampled switched-capacitor architecture 100, along with example clock/control signals that influence the operation of switched-capacitor architecture 100. For simplicity, the schematic shown in FIG. 1 is depicted in a single-ended configuration. Switched-capacitor architecture 100 generally includes an amplifier 102, a first switched-capacitor arrangement 104, a second switched-capacitor arrangement 106, a first digital logic component 108, and a second digital logic component 110. The digital logic components generate switch control signals for the switched-capacitor arrangements. Switched-capacitor architecture 100 also includes an input node 112 for receiving an input voltage signal, an output node 114 for providing a voltage sample sequence that is derived from the input voltage signal, a first reference node 116 for a first reference voltage VREFP, and a second reference node 118 for a second reference voltage VREFM.

The switches are controlled by the p1 and p2 clock signals depicted in FIG. 1 and by the switch control signals generated by digital logic components 108/110. The switches in FIG. 1 are labeled with their respective governing clock/control signals. In this example, when a clock/control signal is high, the associated switch is closed, and when a clock/control signal is low, the associated switch is open. Thus, when the p1 clock signal is high and the p2 clock signal is low, the $C_{1i}$ and $C_{2i}$ capacitors charge to sample the input voltage applied to input node 112. In addition, the $C_{1q}$ and $C_{2q}$ capacitors are coupled to amplifier 102, which generates an output voltage at output node 114. Moreover, either the $h_q$ switch, the $l_q$ switch, or the $m_q$ switch is closed depending upon the comparison of the input voltage present at input node 112 relative to a high voltage reference (VH) and a low voltage reference (VL). The output voltage at output node 104 will depend upon which of these three switches is closed.

When the p1 clock signal is low and the p2 clock signal is high, the $C_{1q}$ and $C_{2q}$ capacitors charge to sample the input voltage applied to input node 112. In addition, the $C_{1i}$ and $C_{2i}$ capacitors are coupled to amplifier 102, which generates an output voltage at output node 114. Moreover, either the $h_i$ switch, the $l_i$ switch, or the $m_i$ switch is closed depending upon the comparison of the input voltage present at input node 112 relative to VH and VL. The output voltage at output node 114 will depend upon which of these three switches is closed.

In double sampled switched-capacitor architectures, both switch networks share the same input section of the amplifier (as depicted in FIG. 1). FIG. 1 shows a parasitic capacitance $C_p$ that represents a capacitance that is inherent to a practical amplifier 102 that utilizes a differential transistor pair as its input section. In such an architecture there is no opportunity to auto-zero amplifier 102 between output phases because an output sample is generated for each available clock phase. Consequently, a residue charge remains at the summing junction of amplifier 102 from phase to phase, and that residue charge results in gain error for amplifier 102. This problem is caused by the sharing of charge on the parasitic capacitance by both switch networks. In a practical embodiment, this error limits the overall accuracy of the switched-capacitor architecture 100.

One possible solution to the problem discussed above is to increase the bandwidth of the amplifier to accommodate additional clock phases during which auto-zeroing can be performed. This proposed solution may not be desirable in practical applications because the proposed solution increases power dissipation and area needed to meet the gain bandwidth product for the application. Moreover, the additional clock phases causes issues with increased clock feed through and charge injection due to the increased switch area needed to accommodate the higher clock rate. This approach increases the overall area of the amplifier, switches, and possibly the capacitor array. Another possible solution to this problem is to utilize two separate channels and, hence, two distinct amplifiers. This proposed solution may not be desirable for practical applications that strive to reduce device size and complexity. For example, the use of separate channels increases the area and power dissipation of the system, due to the use of additional amplifiers.

Accordingly, it is desirable to have an amplifier circuit, suitable for use in a double sampled switched-capacitor architecture, that reduces the gain error that would otherwise be caused by residual parasitic capacitance at the input of the amplifier circuit. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

Figure 1:
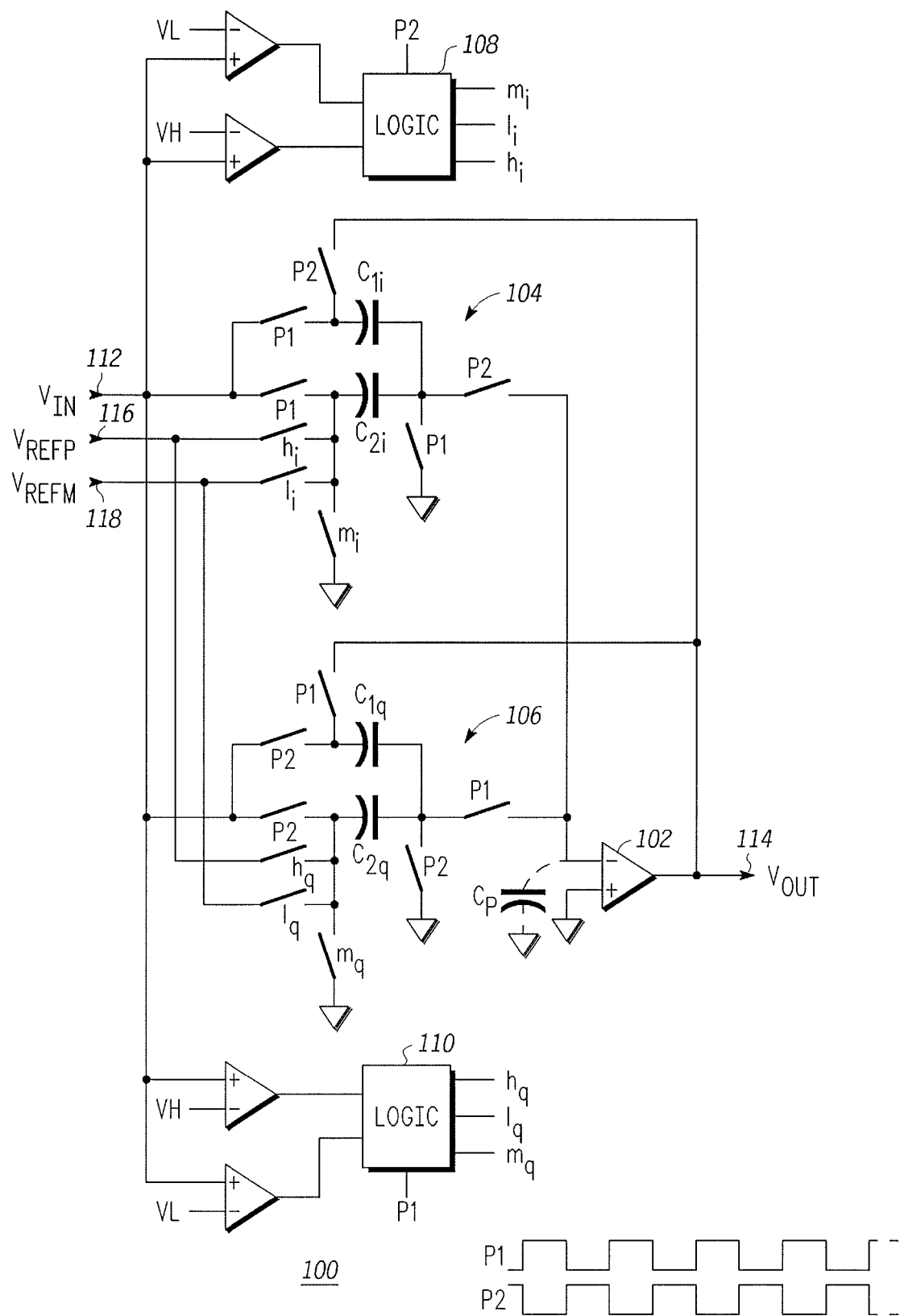
FIG. 1 is a schematic representation of a prior art double sampled switched-capacitor architecture.

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, clocks, digital logic elements, look-up tables, or the like, which may carry out a variety of functions under the control of one or more microprocessors or other control devices. In addition, those skilled in the art will appreciate that the present invention may be practiced in conjunction with any number of applications and that the specific switched-capacitor architectures described herein are merely example applications for the invention.

For the sake of brevity, conventional techniques related to switched capacitance gain stages, power amplifier design, transistor biasing, voltage comparison circuits, digital logic circuits, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node/feature is directly or indirectly joined to (or is in direct or indirect communication with) another node/feature, and not necessarily physically. As used herein, unless expressly stated otherwise, "connected" means that one node/feature is directly joined to (or is in direct communication with) another node/feature. For example, a switch may be "coupled" to a plurality of nodes, but all of those nodes need not always be "connected" to each other; the switch may connect different nodes to each other depending upon the state of the switch.

Furthermore, although the various schematics shown herein depict certain example arrangements of elements, additional intervening elements, devices, features, or components may be present in an actual embodiment (assuming that the functionality of the given circuit is not adversely affected).

Figure 2:
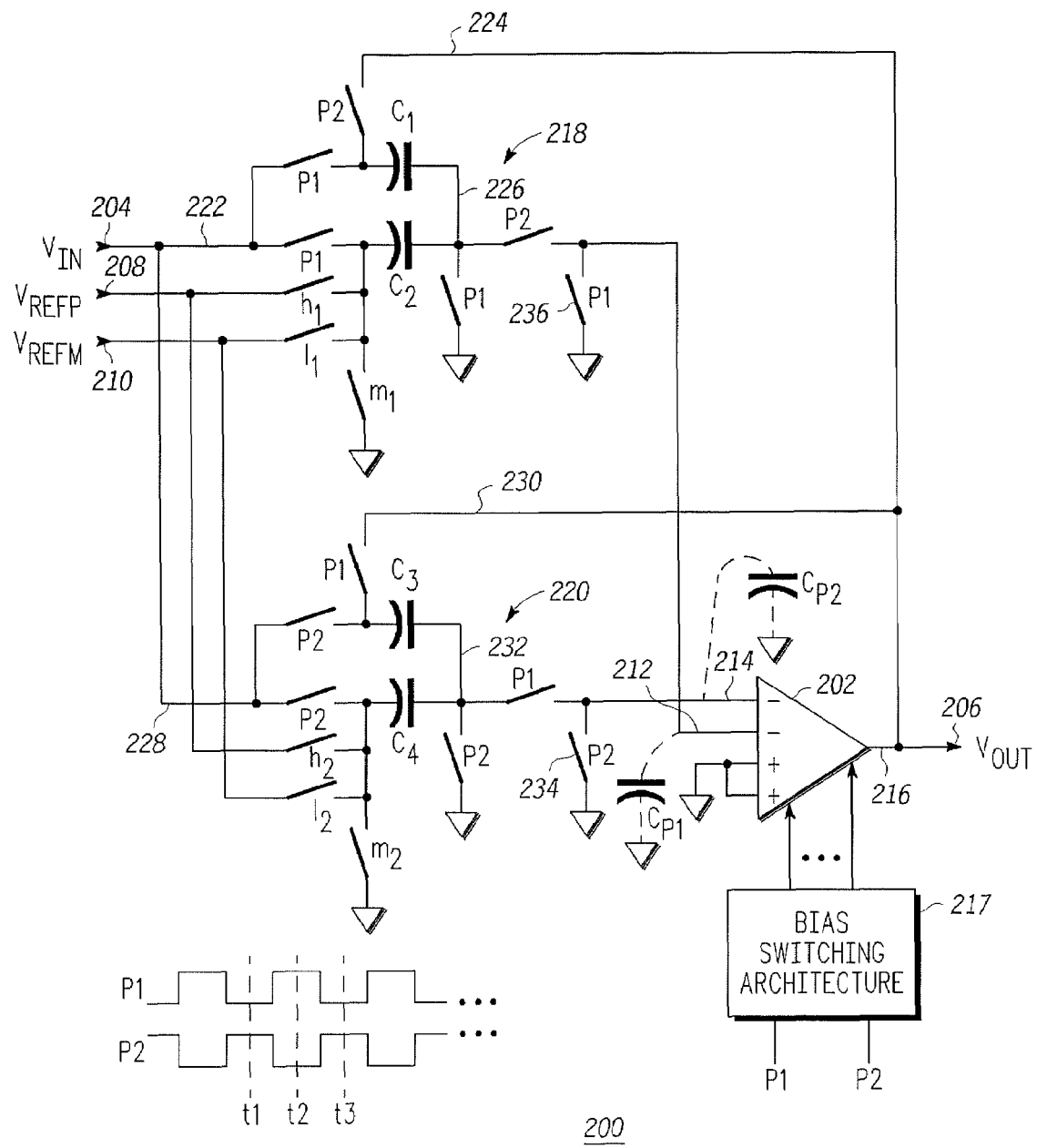
FIG. 2 is a schematic representation of a double sampled switched-capacitor architecture configured in accordance with an example embodiment of the invention.

FIG. 2 is a schematic representation of a double sampled switched-capacitor architecture 200 configured in accordance with an example embodiment of the invention. Also shown in FIG. 2 is a diagram depicting the relative timing of example clock signals that influence the operation of architecture 200. In FIG. 2, the p1 and p2 signals represent clock signals or clock phases that may be based upon or derived from one or more system clocks. In practice, the p1 and p2 signals are complementary and non-overlapping. As described below, these clock signals govern the operation of architecture 200 to facilitate double sampling by an amplifier 202.

Switched-capacitor architecture 200 includes an input node 204 for receiving an input voltage signal (e.g., a varying analog voltage signal, a series or sequence of voltage samples generated by a previous ADC input stage, or the like) and an output node 206 for providing an output voltage signal (e.g., a series or sequence of voltage samples). The series of output voltage samples is derived from the input voltage signal and, more particularly, is derived from first and second voltage sample sequences that are internally generated by architecture 200. Architecture 200 also includes a first reference node 208 for a first reference voltage VREFP, and a second reference node 210 for a second reference voltage VREFM.

Amplifier 202 includes a first amplifier input node 212 for a first amplifier section, a second amplifier input node 214 for a second amplifier section, and an amplifier output node 216. In this example, amplifier 202 is realized as an operational amplifier, first amplifier input node 212 corresponds to one inverting input node for the operational amplifier, second amplifier input node 214 corresponds to another inverting input node for the operational amplifier, amplifier output node 216 corresponds to output node 206 of architecture 200, and the two non-inverting input nodes for the operational amplifier are grounded. Switched-capacitor architecture 200 may include a bias switching architecture 217 coupled to amplifier 202, where bias switching architecture 217 is suitably configured to bias amplifier 202 as described in more detail below. In a practical embodiment, amplifier 202 and bias switching architecture 217 may be realized together as an amplifier circuit.

Switched-capacitor architecture 200 includes a first switched-capacitor arrangement 218 coupled to the first amplifier section, a second switched-capacitor arrangement 220 coupled to the second amplifier section, and a switch architecture that is suitably configured and controlled to cause architecture 200 to sample the input voltage signal and provide, at amplifier output node 216, the series of output voltage samples.

Generally, each switched-capacitor arrangement is coupled to input node 204 to facilitate sampling of the input signal. Switched-capacitor arrangement 218 includes an input node 222 for receiving the input signal, an output node 224 coupled to amplifier output node 216, and a feedback node 226 coupled to amplifier input node 212. In this example, input node 222 corresponds to input node 204, output node 224 corresponds to output node 206, and feedback node 226 is coupled to amplifier input node 212 via a switch in the switch architecture (described in more detail below). Switched-capacitor arrangement 220 includes an input node 228 for receiving the input signal, an output node 230 coupled to amplifier output node 216, and a feedback node 232 coupled to amplifier input node 214. In this example, input node 228 corresponds to input node 204, output node 232 corresponds to output node 206, and feedback node 232 is coupled to amplifier input node 214 via a switch in the switch architecture.

Notably, amplifier 202 employs a first amplifier section (e.g., a first differential transistor pair) devoted to switched-capacitor arrangement 218, and a second amplifier section (e.g., a second differential transistor pair) devoted to switched-capacitor arrangement 220. In other words, the two switch networks do not share a common input to amplifier 202. Thus, in a practical embodiment, each input section of amplifier 202 will have an associated parasitic capacitance. In this regard, FIG. 2 shows a first parasitic capacitance $C_{p1}$ that represents a capacitance that is inherent to the first amplifier section, and a second parasitic capacitance $C_{p2}$ that is inherent to the second amplifier section. As described in more detail below, these two parasitic capacitances are uncorrelated and are decoupled from each other.

In this example embodiment, each switched-capacitor arrangement includes two capacitors. Switched-capacitor arrangement 218, for example, includes a first capacitor (the C1 capacitor) having an input end and an output end, and a second capacitor (the C2 capacitor) having an input end and an output end. The output ends are connected to each other and, in this example, the output ends correspond to feedback node 226 for switched-capacitor arrangement 218. The input ends are connected to respective switches in the switch architecture. Switched-capacitor arrangement 220 may be arranged in a similar manner, however, the output ends of the C3 and C4 capacitors instead correspond to feedback node 232.

In one practical embodiment, switched-capacitor architecture 200 employs fixed capacitors throughout the switched-capacitor arrangements. For example, each switched-capacitor arrangement in architecture 200 may include two capacitors having equal capacitance. Such a fixed configuration may be desirable in applications that do not require dynamic adjustment of gain over time. In another practical embodiment, at least one switched-capacitor arrangement includes a programmable capacitance (e.g., a variable, adjustable, or selectable capacitance). A programmable capacitance suitable for use with architecture 200 may be realized as an array or a bank of capacitors having binary-weighted values (e.g., 2 pF, 4 pF, 8 pF, etc.), where any suitable combination can be selected using an appropriate control mechanism, such as digital control logic. Such a programmable capacitor array is disclosed in U.S. Pat. No. 5,625,361, the content of which is incorporated by reference herein. Programmable capacitances may be utilized in applications where it is desirable to vary the gain provided by the different switched-capacitor arrangements. In practice, a given capacitor may be programmed to provide different capacitances for the sampling phase and the gain phase described herein.

The switch architecture for switched-capacitor architecture 200 includes a plurality of switches that are suitably controlled by clock signals, switch control logic, and/or any appropriate control mechanism configured to carry out the operations described herein. For example, referring to switched-capacitor arrangement 218, the switch architecture is configured to connect the input ends of the C1 and C2 capacitors to input node 204, and to connect the output ends of the C1 and C2 capacitors to a reference potential (e.g., ground) for sampling of the input voltage signal. In addition, the switch architecture is configured to connect the C1 capacitor between amplifier input node 212 and amplifier output node 216, to connect the output end of the C2 capacitor to amplifier input node 212, and to connect the input end of the C2 capacitor to a reference voltage (e.g., a programmable voltage value, a fixed positive reference voltage value (VREFP), zero, or a fixed negative reference voltage value (VREFM)) for output voltage generation. Similar switching can be performed for sampling and output phases of switched-capacitor arrangement 220.

The operation of switched-capacitor architecture 200 will be summarized below with reference to the clock signals shown in FIG. 2. The switches in architecture 200 are controlled by the clock signals depicted in FIG. 2 and by switch control signals generated by a suitably configured switch control architecture and/or by suitably configured switch control logic (not shown in FIG. 2). The switches in FIG. 2 are labeled with their respective governing clock/control signals. In this example, when a clock/control signal is high, the associated switch is closed, and when a clock/control signal is low, the associated switch is open. In FIG. 2, $t_1$ indicates the entire clock phase during which the p1 clock signal is low and the p2 clock signal is high. Likewise, the other time designators are intended to represent the respective clock phases (i.e., periods of time).

Beginning (arbitrarily) during time $t_1$, the p2 clock signal is high and the switches labeled p2 in FIG. 2 are closed. Concurrently, the p1 clock signal is low and the switches labeled p1 in FIG. 2 are open. During time $t_1$, switched-capacitor arrangement 220 is controlled such that the C3 and C4 capacitors charge to sample the input voltage present at input node 204. Also during time $t_1$, switched-capacitor arrangement 218 is controlled such that the C1 and C2 capacitors are coupled to amplifier 202, which generates an output voltage at output node 206. This output corresponds to a previously sampled input voltage stored by the C1 and C2 capacitors. In addition, depending upon the particular control scheme for the switch architecture, either the $h_1$ switch, the $l_1$ switch, or the $m_1$ switch is closed, thus impacting the magnitude of the output voltage present at output node 206 in a manner similar to that described above. In other words, the amplifier output voltage is based upon a past-sampled voltage stored by switched-capacitor arrangement 218, and based upon a selectable reference voltage (selected using the $h_1$ switch, the $l_1$ switch, or the $m_1$ switch).

Moreover, during time $t_1$ switched-capacitor arrangement 220 may be suitably controlled to zero or ground the $C_{p2}$ parasitic capacitance. In this regard, switched-capacitor arrangement 220 may include an auto-zeroing switch 234 coupled between amplifier input node 214 and ground, where auto-zeroing switch 234 is closed when clock signal p2 is high and open when clock signal p2 is low. Thus, during the sampling period corresponding to the $t_1$ time period, auto-zeroing switch 234 shorts the $C_{p2}$ capacitance to ground, resulting in zeroing of the $C_{p2}$ capacitance. The grounding of the $C_{p2}$ capacitance reduces gain error associated with this input channel of amplifier 202.

During a subsequent time $t_2$, the p1 clock signal is high and the switches labeled p1 in FIG. 2 are closed. Concurrently, the p2 clock signal is low and the switches labeled p2 in FIG. 2 are open. During time $t_2$, switched-capacitor arrangement 218 is controlled such that the C1 and C2 capacitors charge to sample the input voltage present at input node 204. Also during time $t_2$, switched-capacitor arrangement 220 is controlled such that the C3 and C4 capacitors are coupled to amplifier 202, which generates an output voltage at output node 206. This output corresponds to the previously sampled input voltage stored by the C3 and C4 capacitors during time $t_1$. In addition, depending upon the particular control scheme for the switch architecture, either the $h_2$ switch, the $l_2$ switch, or the m₂ switch is closed, thus impacting the magnitude of the output voltage present at output node 206 in a manner similar to that described above. In other words, the amplifier output voltage is based upon a past-sampled voltage stored by switched-capacitor arrangement 220, and based upon a selectable reference voltage (selected using the h₂ switch, the l₂ switch, or the m₂ switch).

Moreover, during time t₂ switched-capacitor arrangement 218 may be suitably controlled to zero or ground the $C_{p1}$ parasitic capacitance. In this regard, switched-capacitor arrangement 218 may include an auto-zeroing switch 236 coupled between amplifier input node 212 and ground, where auto-zeroing switch 236 is closed when clock signal p1 is high and open when clock signal p1 is low. Thus, during the sampling period corresponding to the t₂ time period, auto-zeroing switch 236 shorts the $C_{p1}$ capacitance to ground, resulting in zeroing of the $C_{p1}$ capacitance. The grounding of the $C_{p1}$ capacitance reduces gain error associated with this input channel of amplifier 202.

The clock phase identified by t₃ represents the beginning of another iteration of the procedure described above, i.e., the state of the clock signals during time t₃ is equivalent to the state of the clock signals during time t₁. Thus, switched-capacitor architecture 200 is configured to consecutively alternate between the two sampling phases and to consecutively alternate between the two output gain phases. In the context of architecture 200, a single input voltage signal is double sampled and a single amplifier (e.g., amplifier 202) generates a series of output voltage samples on every clock phase (relative to the p1 clock signal or the p2 clock signal). In practice, architecture 200 may be configured to instead sample two different input voltage signals and generate a series of interleaved output voltage samples at output node 206. For example, such an embodiment could be utilized to process in-phase and quadrature signal components in a data communication system.

Figure 3:
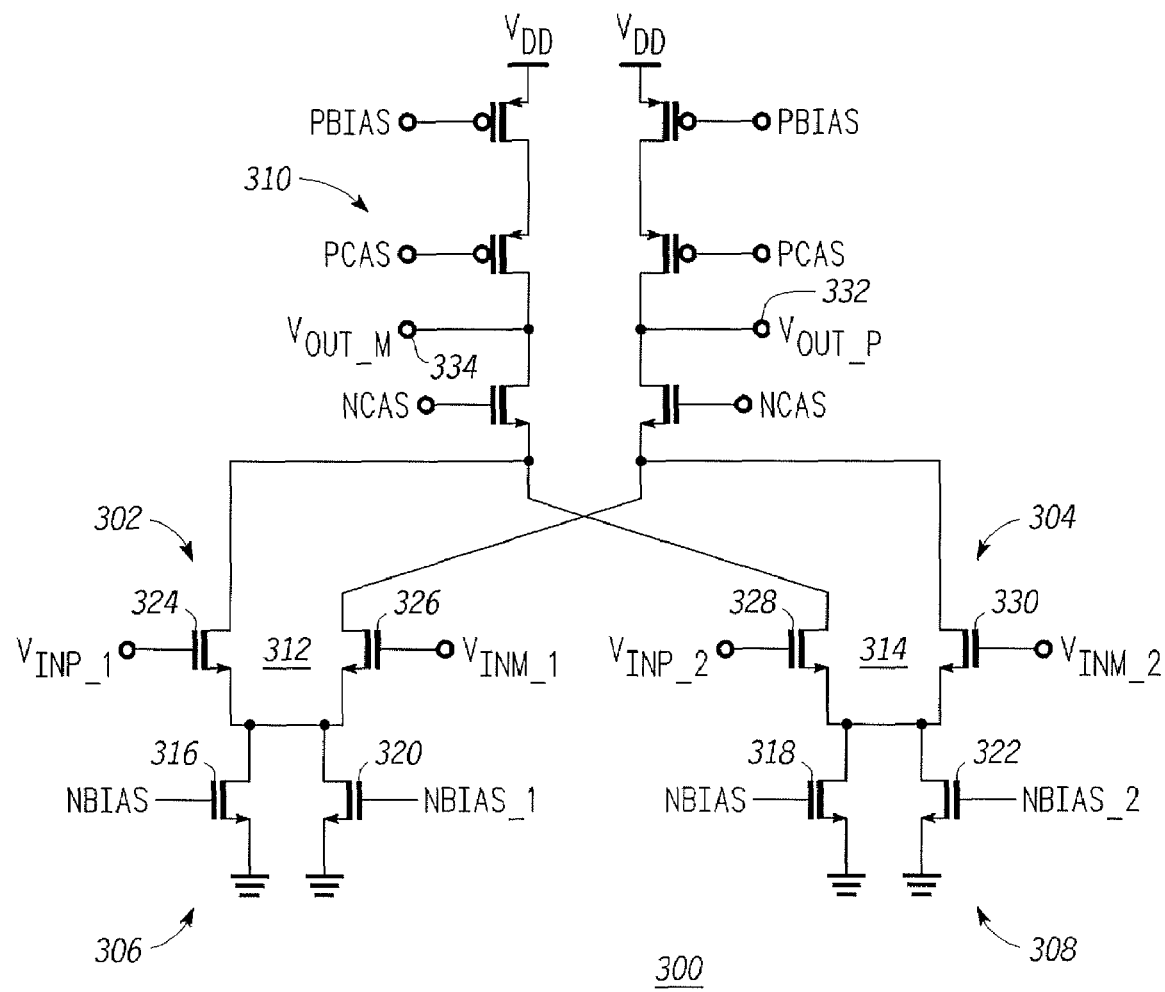
FIG. 3 is a schematic representation an amplifier circuit configured in accordance with an example embodiment of the invention.

In practice, amplifier 202 can be realized using suitable transistor-based circuits. FIG. 3 is a schematic representation an amplifier circuit 300 configured in accordance with an example embodiment of the invention. Amplifier 202 may be realized with amplifier circuit 300 or a suitable equivalent. Amplifier circuit 300 is depicted as a fully differential circuit. Of course, a simplified single-ended version of amplifier circuit 300 can be derived from the schematic shown in FIG. 3.

Amplifier circuit 300 generally includes a first amplifier section 302 for a first input, a second amplifier section 304 for a second input, a first tail current bias arrangement 306 coupled to first amplifier section 302, a second tail current bias arrangement 308 coupled to second amplifier section 304, and an output section 310 that provides an output signal. In the example embodiment, first amplifier section 302 comprises a first differential transistor pair 312, and second amplifier section 304 comprises a second differential transistor pair 314. In the example embodiment, first tail current bias arrangement 306 comprises a first bias transistor 316, second tail current bias arrangement 308 comprises a second bias transistor 318, first tail current bias arrangement 306 comprises a third bias transistor 320 coupled in parallel with first bias transistor 316, and second tail current bias arrangement 308 comprises a fourth bias transistor 322 coupled in parallel with second bias transistor 318.

Differential transistor pair 312 includes a first transistor 324 and a second transistor 326 arranged as shown in FIG. 3. The gate of first transistor 324 receives the positive component of the input signal for differential transistor pair 312, and the gate of second transistor 326 receives the negative component of the input signal for differential transistor pair 312.

Referring to FIG. 2, the input signal for differential transistor pair 312 would correspond to the input present at amplifier input node 212. Differential transistor pair 314 includes a third transistor 328 and a fourth transistor 330 arranged as shown in FIG. 3. The gate of third transistor 328 receives the positive component of the input signal for differential transistor pair 314, and the gate of fourth transistor 330 receives the negative component of the input signal for differential transistor pair 314. Referring to FIG. 2, the input signal for differential transistor pair 314 would correspond to the input present at amplifier input node 214.

In this example embodiment, output section 310 includes a first output node 332 and a second output node 334. First output node 332 provides the positive component of the output signal for amplifier circuit 300, and second output node 334 provides the negative component of the output signal for amplifier circuit 300. Referring to FIG. 2, the output signal would correspond to the output present at amplifier output node 216. Output section 310 also includes a number of transistors connected to a supply voltage; these transistors are configured to provide output current and increased output impedance to enhance open loop gain. Those skilled in the art will understand the topology and operation of such transistors.

First tail current bias arrangement 306 is suitably configured and controlled to conduct a first tail current for first amplifier section 302, and second tail current bias arrangement 308 is suitably configured and controlled to conduct a second tail current for second amplifier section 304. As used herein, a "tail current" is described as the bias current for an input differential pair. As described in more detail below, the tail current bias arrangements are controlled using suitable switching controls such that they are alternately activated and deactivated. In accordance with a first example embodiment, during a first bias state, first tail current bias arrangement 306 is fully activated while second tail current bias arrangement 308 is only slightly activated, and during a second bias state, second tail current bias arrangement 308 is fully activated while first tail current bias arrangement 306 is only slightly activated. In other words, for the first bias state, first tail current bias arrangement 306 operates in a normal manner to activate first amplifier section 312 while second tail current bias arrangement 308 operates in a sub-threshold manner to maintain second amplifier section 312 in a standby condition that conducts a small trickle current. For the second bias state, the roles are reversed such that second amplifier section 314 is activated while first amplifier section 312 operates in a standby mode. In practice, the standby state allows the respective amplifier section to quickly respond to the switching states. The ratio of the trickle current conducted by bias transistor 316 (318) to the current conducted by bias transistor 320 (322) may be selected to suit the needs of the given application. For example, the ratio may be 1:10, 1:20, 1:100, or the like, depending upon the design criteria. If the transistor devices are relatively small, and the semiconductor manufacturing process is "fast," then a relatively low trickle current may suffice.

Regarding the first example embodiment, bias transistor 316 of first tail current bias arrangement 306 is suitably configured and controlled to conduct either full current or trickle current for first amplifier section 312. Both currents are maintained throughout the first and second bias states. In a practical embodiment, these currents can be constantly maintained during normal operation of amplifier circuit 300. Likewise, bias transistor 318 of second tail current bias arrangement 308 is suitably configured and controlled to conduct a trickle current for second amplifier section 314.

Therefore, the bias switching of amplifier circuit 300 is performed by alternately activating/deactivating bias transistor 320 of first tail current bias arrangement 306 and bias transistor 322 of second tail current bias arrangement 308. In this regard, activation of bias transistor 320 achieves full activation of first amplifier section 312, activation of bias transistor 322 achieves full activation of second amplifier section 314, deactivation of bias transistor 320 achieves partial deactivation of first amplifier section 312, and deactivation of bias transistor 322 achieves partial deactivation of second amplifier section 314.

In accordance with a second example embodiment, during a first bias state, first tail current bias arrangement 306 is fully activated while second tail current bias arrangement 308 is deactivated, and during a second bias state, second tail current bias arrangement 308 is fully activated while first tail current bias arrangement 306 is deactivated. In other words, although the trickle current technique described above may be desirable in certain applications, it need not be utilized in all practical embodiments.

In the example embodiment depicted in FIG. 3, a first bias control signal (nbias_1) is applied to the gate of transistor 320, and a second bias control signal (nbias_2) is applied to the gate of transistor 322. A common bias control signal (nbias) is applied to the gate of transistor 316 and to the gate of transistor 318. The common nbias signal can be employed in the first example embodiment described above to provide a symmetrical current for transistors 316 and 318 such that the differential pair in low power mode maintains proper bias for quick return to normal operation. Referring to FIG. 2, these bias control signals may be generated by bias switching architecture 217.

Figure 4:
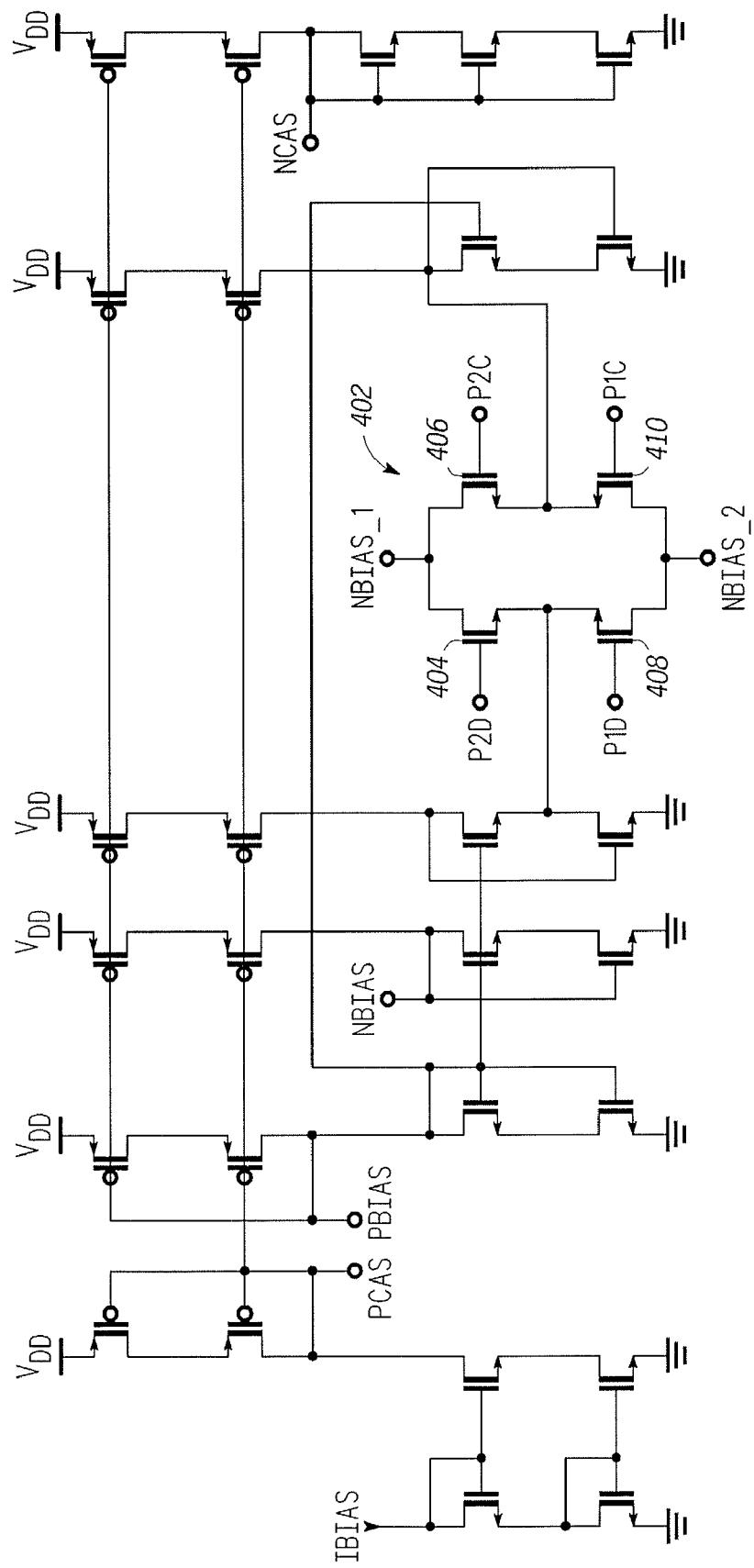
FIG. 4 is a schematic representation of a bias switching architecture configured in accordance with an example embodiment of the invention.

FIG. 4 is a schematic representation of a bias switching architecture 400 configured in accordance with an example embodiment of the invention. Bias switching architecture 400 represents one practical implementation suitable for use in connection with the amplifier circuit described herein (for example, bias switching architecture 400 is suitable for use with amplifier circuit 300). A bias switching architecture according to the invention is not limited to the specific topology of bias switching architecture 400, and a practical embodiment may utilize equivalent circuits having different topologies. In practice, bias switching architecture 400 may include or incorporate first tail current bias arrangement 306 and/or second tail current bias arrangement 308. Moreover, amplifier circuit 300 may include or incorporate bias switching architecture 400.

Bias switching architecture 400 may leverage any number of known techniques to generate the bias and/or control signals utilized by amplifier circuit 300. Bias switching architecture 400 is suitably configured to receive a supply voltage (Vdd), a bias current (ibias) from a current source, and four clock/control signals (identified as the p2d, p2c, p1d, and p1c signals). Bias switching architecture 400 is also suitably configured to provide the following bias/control signals as outputs: pcas; pbias; nbias; ncas; nbias_1; and nbias_2. In this example, each of these outputs corresponds to a respective input shown in FIG. 3. In practice, each of these outputs represents a bias voltage.

The p2d, p2c, p1d, and p1c clock signals may be derived or based upon the p1 and p2 clock signals described above in connection with switched-capacitor architecture 200. The p2d clock signal represents a slightly delayed version of the p2 clock signal, where such delay may be desirable in a practical implementation to minimize the effect of charge injection. With respect to the relative timing of bias switching architecture 400 and amplifier circuit 300, the relative timing of the two bias states/phases, the relative timing of the two sampling states/phases, and the relative timing of the two output gain states/phases, the p2d clock signal is equivalent to the p2 clock signal. The p2c clock signal represents the complement of the p2d clock signal; for purposes of this description the p2c clock signal is equivalent to the p1 clock signal. The p1d clock signal represents a slightly delayed version of the p1 clock signal; for purposes of this description the p1d clock signal is equivalent to the p1 clock signal. The p1c clock signal represents the complement of the p1d clock signal; for purposes of this description the p1c clock signal is equivalent to the p2 clock signal. Notably, all of these clock signals are non-overlapping.

Bias switching architecture 400 includes a switching mechanism 402 that controls the generation of the nbias_1 and nbias_2 signals. Switching mechanism 402 includes a first transistor 404, a second transistor 406, a third transistor 408, and a fourth transistor 410. These transistors are preferably arranged as shown in FIG. 4. For example, the gate of transistor 404 receives the p2d clock signal, the gate of transistor 406 receives the p2c clock signal, the gate of transistor 408 receives the p1d clock signal, and the gate of transistor 410 receives the p1c clock signal. The drain of transistor 404 is coupled to the drain of transistor 406, and this common node serves as the output node for the nbias_1 signal. The drain of transistor 408 is coupled to the drain of transistor 410, and this common node serves as the output node for the nbias_2 signal. The source of transistor 404 is coupled to the source of transistor 408, and this common node is maintained at a relatively low voltage that is below the normal turn-on voltage for the transistors. The source of transistor 406 is coupled to the source of transistor 410, and this common node is maintained at a relatively high voltage that is above the normal turn-on voltage for the transistors.

Referring again to FIG. 2 and FIG. 3, $t_1$ indicates one sampling period during which second switched-capacitor arrangement 220 samples the input voltage signal, and during which first switched-capacitor arrangement 218 provides its sampled voltage to first amplifier section 312. This sampling period also corresponds to a bias state where the p2d and p1c clock signals are high and the p2c and p1d clock signals are low (see FIG. 4). In response to this bias state, switching mechanism 402 drives the nbias_1 signal to a high voltage and drives the nbias_2 signal to a low voltage. Referring to FIG. 3, this condition activates first tail current bias arrangement 306, which in turn activates first differential transistor pair 312, and partially deactivates second tail current bias arrangement 308, which in turn partially deactivates second differential transistor pair 314 (i.e., second tail current bias arrangement 308 and second differential transistor pair 314 operate in the standby mode described above).

The time $t_2$ indicates the next consecutive sampling period during which first switched-capacitor arrangement 218 samples the input voltage signal, and during which second switched-capacitor arrangement 220 provides its sampled voltage to second amplifier section 314. This subsequent sampling period also corresponds to a different bias state where the p2c and p1d clock signals are high and the p2d and p1c clock signals are low. In response to this bias state, switching mechanism 402 drives the nbias_2 signal to a high voltage and drives the nbias_1 signal to a low voltage. Referring to FIG. 3, this condition activates second tail current bias arrangement 308, which in turn activates second differential transistor pair 314, and partially deactivates first tail current bias arrangement 306, which in turn partially deactivates first differential transistor pair 312 (i.e., first tail current bias arrangement 306 and first differential transistor pair 312 operate in the standby mode described above). In this manner, the various clock signals control bias switching architecture 400 such that it consecutively alternates between the two bias states. This results in activation of only one amplifier section at a time, where such activation toggles back and forth between the two amplifier sections.

In summary, systems, devices, and methods configured in accordance with example embodiments of the invention relate to:

A double sampled multiple-input amplifier circuit having a first differential transistor pair for a first input, a second differential transistor pair for a second input, a first tail current bias arrangement coupled to said first differential transistor pair and configured to conduct a first tail current for said first differential transistor pair, a second tail current bias arrangement coupled to said second differential transistor pair and configured to conduct a second tail current for said second differential transistor pair, and a bias switching architecture coupled to said first tail current bias arrangement and to said second tail current bias arrangement, said bias switching architecture being configured to alternately activate said first tail current bias arrangement and said second tail current bias arrangement. The bias switching architecture may be configured to alternate between a first bias state and a second bias state, the first bias state corresponds to activation of said first tail current bias arrangement and deactivation of said second tail current bias arrangement, and said second bias state corresponds to activation of said second tail current bias arrangement and deactivation of said first tail current bias arrangement. The bias switching architecture may be configured to alternate between a first bias state and a second bias state, said first bias state corresponds to full activation of said first tail current bias arrangement and partial activation of said second tail current bias arrangement, and said second bias state corresponds to full activation of said second tail current bias arrangement and partial activation of said first tail current bias arrangement. The first tail current bias arrangement may comprise a first bias transistor configured to conduct a first trickle current for said first differential transistor pair, and said second tail current bias arrangement may comprise a second bias transistor configured to conduct a second trickle current for said second differential transistor pair. The first tail current bias arrangement may comprise a third bias transistor coupled in parallel with said first bias transistor, and said second tail current bias arrangement may comprise a fourth bias transistor coupled in parallel with said second bias transistor. The bias switching architecture may be configured to alternate between a first bias state and a second bias state, said first bias state corresponds to activation of said third bias transistor and deactivation of said fourth bias transistor, and said second bias state corresponds to activation of said fourth bias transistor and deactivation of said third bias transistor.

A double sampled multiple-input amplifier circuit having a first amplifier section for a first input, a second amplifier section for a second input, and a bias switching architecture coupled to said first amplifier section and to said second amplifier section, said bias switching architecture being configured to alternate between a first bias state and a second bias state for said amplifier circuit, wherein said first bias state corresponds to activation of said first amplifier section and at least partial deactivation of said second amplifier section, and said second bias state corresponds to activation of said second amplifier section and at least partial deactivation of said first amplifier section. The first amplifier section may comprise a first differential transistor pair, and said second amplifier section may comprise a second differential transistor pair. The bias switching architecture may comprise a first tail current bias arrangement coupled to said first amplifier section and configured to conduct a first tail current for said first amplifier section, and a second tail current bias arrangement coupled to said second amplifier section and configured to conduct a second tail current for said second amplifier section. The first tail current bias arrangement may comprise a first bias transistor configured to conduct a first trickle current for said first amplifier section, and said second tail current bias arrangement may comprise a second bias transistor configured to conduct a second trickle current for said second amplifier section. The first tail current bias arrangement may comprise a third bias transistor coupled in parallel with said first bias transistor, said second tail current bias arrangement may comprise a fourth bias transistor coupled in parallel with said second bias transistor, while, for said first bias state, said bias switching architecture deactivates said fourth bias transistor to achieve at least partial deactivation of said second amplifier section, and, for said second bias state, said bias switching architecture deactivates said third bias transistor to achieve at least partial deactivation of said first amplifier section. The first tail current bias arrangement may comprise a third bias transistor coupled in parallel with said first bias transistor, said second tail current bias arrangement may comprise a fourth bias transistor coupled in parallel with said second bias transistor, while, for said first bias state, said bias switching architecture activates said third bias transistor to achieve activation of said first amplifier section, and, for said second bias state, said bias switching architecture activates said fourth bias transistor to achieve activation of said second amplifier section. The bias switching architecture may be configured to consecutively alternate between said first bias state and said second bias state. The amplifier circuit may further comprise a first switched-capacitor arrangement coupled to said first amplifier section and configured to provide its sampled voltage to said first amplifier section during a first sampling period corresponding to said first bias state, and a second switched-capacitor arrangement coupled to said second amplifier section and configured to provide its sampled voltage to said second amplifier section during a second sampling period corresponding to said second bias state. The first switched-capacitor arrangement may be configured to sample its input signal during said second sampling period, and said second switched-capacitor arrangement may be configured to sample its input signal during said first sampling period. The first switched-capacitor arrangement can be configured to zero a first parasitic capacitance associated with said first amplifier section during said second sampling period, and said second switched-capacitor arrangement can be configured to zero a second parasitic capacitance associated with said second amplifier section during said first sampling period.

A biasing method for a double sampled multiple-input amplifier circuit comprising a first input, a first amplifier section coupled to said first input, a second input, and a second amplifier section coupled to said second input, said method comprising switching said amplifier circuit to a first state, activating said first amplifier section in response to switching said amplifier circuit to said first state, at least partially deactivating said second amplifier section in response to switching said amplifier circuit to said first state, switching said amplifier circuit to a second state, activating said second amplifier section in response to switching said amplifier circuit to said second state, and at least partially deactivating said first amplifier section in response to switching said amplifier circuit to said second state. The method may further comprise maintaining a first trickle current for said first amplifier section throughout said first state and said second state, and maintaining a second trickle current for said second amplifier section throughout said first state and said second state. Switching said amplifier circuit to said first state and switching said amplifier circuit to said second state can be repeated such that said first state and said second said state alternate consecutively. The method may further comprise providing a first sampled voltage to said first amplifier section during a first sampling period corresponding to said first bias state, providing a second sampled voltage to said second amplifier section during a second sampling period corresponding to said second bias state, sampling said first input signal during said second sampling period, and sampling said second input signal during said first sampling period. The method may further comprise zeroing a first parasitic capacitance associated with said first amplifier section during said second sampling period, and zeroing a second parasitic capacitance associated with said second amplifier section during said first sampling period.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A double sampled multiple-input amplifier circuit comprising:
   a first amplifier section for a first sampled differential input;
   a second amplifier section for a second sampled differential input, said first sampled differential input and said second sampled differential input being sampled at different times; and
   a bias switching architecture coupled to said first amplifier section and to said second amplifier section, said bias switching architecture being configured to alternate between a first bias state and a second bias state for said amplifier circuit; wherein
   said first bias state corresponds to activation of said first amplifier section and partial activation of said second amplifier section;
   said second bias state corresponds to activation of said second amplifier section and partial activation of said first amplifier section;
   said bias switching architecture comprises:
      a first bias transistor having a drain coupled to said first amplifier section, a gate, and a source coupled to ground;
      a second bias transistor having a drain coupled to said second amplifier section, a gate, and a source coupled to ground;
      a third bias transistor having a drain coupled to said first amplifier section, a gate, and a source coupled to ground, said third bias transistor being connected in parallel with said first bias transistor; and
      a fourth bias transistor having a drain coupled to said second amplifier section, a gate, and a source coupled to ground, said fourth bias transistor being connected in parallel with said second bias transistor;

said gate of said third bias transistor receives a first bias control signal, said gate of said fourth bias transistor receives a second bias control signal, said gate of said first bias transistor receives a common bias control signal, and said gate of said second bias transistor receives said common bias control signal; and
   said first bias control signal, said second bias control signal, and said common bias control signal are different and distinct signals.

2. An amplifier circuit according to claim 1, said first amplifier section comprising a first differential transistor pair, and said second amplifier section comprising a second differential transistor pair.

3. An amplifier circuit according to claim 1, wherein:
   said first bias transistor and said third bias transistor form a first tail current bias arrangement for said first amplifier section, and said first tail current bias arrangement is configured to conduct a first tail current for said first amplifier section; and
   said second bias transistor and said fourth bias transistor form a second tail current bias arrangement for said second amplifier section, and said second tail current bias arrangement is configured to conduct a second tail current for said second amplifier section.

4. An amplifier circuit according to claim 3, wherein:
   said first bias transistor is configured to conduct a first trickle current for said first amplifier section; and
   said second bias transistor is configured to conduct a second trickle current for said second amplifier section.

5. An amplifier circuit according to claim 4, wherein:
   for said first bias state, said bias switching architecture deactivates said fourth bias transistor to achieve partial activation of said second amplifier section; and
   for said second bias state, said bias switching architecture deactivates said third bias transistor to achieve partial activation of said first amplifier section.

6. An amplifier circuit according to claim 4, wherein:
   for said first bias state, said bias switching architecture activates said third bias transistor to achieve activation of said first amplifier section; and
   for said second bias state, said bias switching architecture activates said fourth bias transistor to achieve activation of said second amplifier section.

7. An amplifier circuit according to claim 1, said bias switching architecture being configured to consecutively alternate between said first bias state and said second bias state.

8. An amplifier circuit according to claim 1, further comprising:
   a first switched-capacitor arrangement coupled to said first amplifier section and configured to provide its sampled voltage to said first amplifier section during a first sampling period corresponding to said first bias state; and
   a second switched-capacitor arrangement coupled to said second amplifier section and configured to provide its sampled voltage to said second amplifier section during a second sampling period corresponding to said second bias state.

9. An amplifier circuit according to claim 8, wherein:
   said first switched-capacitor arrangement is configured to sample its input signal during said second sampling period; and
   said second switched-capacitor arrangement is configured to sample its input signal during said first sampling period.

10. An amplifier circuit according to claim 8, wherein:
said first switched-capacitor arrangement is configured to zero a first parasitic capacitance associated with said first amplifier section during said second sampling period; and
said second switched-capacitor arrangement is configured to zero a second parasitic capacitance associated with said second amplifier section during said first sampling period.

11. A double sampled multiple-input amplifier circuit comprising:
a first differential transistor pair for a first differential input, the first differential transistor pair having a first common terminal node;
a second differential transistor pair for a second differential input, the second differential transistor pair having a second common terminal node;
a first bias arrangement coupled to the first differential transistor pair and configured to conduct a first current for the first differential transistor pair, the first bias arrangement comprising a first bias transistor having a first terminal, a second terminal, and a third terminal, and a third bias transistor having a first terminal, a second terminal, and a third terminal, the first bias transistor and the third bias transistor being coupled in parallel between the first differential transistor pair and a first common node such that the first terminal of the first bias transistor and the first terminal of the third bias transistor are both coupled to the first common terminal node, and such that the third terminal of the first bias transistor and the third terminal of the third bias transistor are both coupled to the first common node;
a second bias arrangement coupled to the second differential transistor pair and configured to conduct a second current for the second differential transistor pair, the second bias arrangement comprising a second bias transistor having a first terminal, a second terminal, and a third terminal, and a fourth bias transistor having a first terminal, a second terminal, and a third terminal, the second bias transistor and the fourth bias transistor being coupled in parallel between the second differential transistor pair and a second common node such that the first terminal of the second bias transistor and the first terminal of the fourth bias transistor are both coupled to the second common terminal node, and such that the third terminal of the second bias transistor and the third terminal of the fourth bias transistor are both coupled to the second common node; and
a bias switching architecture coupled to the first bias arrangement and to the second bias arrangement, the bias switching architecture being configured to alternately activate the first bias arrangement and the second bias arrangement using a first bias control signal for the first bias arrangement, a second bias control signal for the second bias arrangement, and a common bias control signal for the first bias arrangement and the second bias arrangement, where the first bias control signal, the second bias control signal, and the common bias control signal are different and distinct signals, and wherein the second terminal of the third bias transistor receives the first bias control signal, the second terminal of the fourth bias transistor receives the second bias control signal, the second terminal of the first bias transistor receives the common bias control signal, and the second terminal of the second bias transistor receives the common bias control signal.

12. The amplifier circuit of claim 11, wherein:
the first terminal of the first bias transistor is the drain terminal of the first bias transistor; and
the first terminal of the second bias transistor is the drain terminal of the second bias transistor.

13. The amplifier circuit of claim 11, wherein:
the second terminal of the first bias transistor is the gate terminal of the first bias transistor; and
the second terminal of the second bias transistor is the gate terminal of the second bias transistor.

14. The amplifier circuit of claim 11, wherein:
the third terminal of the first bias transistor is the source terminal of the first bias transistor; and
the third terminal of the second bias transistor is the source terminal of the second bias transistor.

15. The amplifier circuit of claim 11, wherein:
the first common terminal node is a common source node for the first differential transistor pair; and
the second common terminal node is a common source node for the second differential transistor pair.

16. An amplifier circuit comprising:
four input transistors for two differential inputs, each of the four input transistors having a respective first terminal, a respective second terminal, and a respective third terminal;
four bias transistors associated with the four input transistors, each of the four bias transistors having a respective first terminal, a respective second terminal, and a respective third terminal; wherein
a first of the four input transistors has its second terminal coupled to receive a positive component of a first differential input signal, a second of the four input transistors has its second terminal coupled to receive a negative component of the first differential input signal, a third of the four input transistors has its second terminal coupled to receive a positive component of a second differential input signal, and a fourth of the four input transistors has its second terminal coupled to receive a negative component of the second differential input signal;
a first of the four bias transistors has its second terminal coupled to receive a first bias control signal, a second of the four bias transistors has its second terminal coupled to receive a second bias control signal, a third of the four bias transistors has its second terminal coupled to receive the first bias control signal, and a fourth of the four bias transistors has its second terminal coupled to receive a third bias control signal, where the first bias control signal, the second bias control signal, and the third common bias control signal are different and distinct signals;
the third terminal of the first input transistor, the third terminal of the second input transistor, the first terminal of the first bias transistor, and the first terminal of the second bias transistor are coupled together; and
the third terminal of the third input transistor, the third terminal of the fourth input transistor, the first terminal of the third bias transistor, and the first terminal of the fourth bias transistor are coupled together.

17. The amplifier circuit of claim 16, wherein:
the second terminal of the first input transistor is its gate terminal;
the second terminal of the second input transistor is its gate terminal;
the second terminal of the third input transistor is its gate terminal; and
the second terminal of the fourth input transistor is its gate terminal.

18. The amplifier circuit of claim 16, wherein:
the second terminal of the first bias transistor is its gate terminal;
the second terminal of the second bias transistor is its gate terminal;
the second terminal of the third bias transistor is its gate terminal; and
the second terminal of the fourth bias transistor is its gate terminal.

19. The amplifier circuit of claim 16, wherein:
the third terminal of the first input transistor is its source terminal;
the third terminal of the second input transistor is its source terminal;
the third terminal of the third input transistor is its source terminal;
the third terminal of the fourth input transistor is its source terminal;
the first terminal of the first bias transistor is its drain terminal;
the first terminal of the second bias transistor is its drain terminal;
the first terminal of the third bias transistor is its drain terminal; and
the first terminal of the fourth bias transistor is its drain terminal.

20. The amplifier circuit of claim 16, further comprising a bias switching architecture coupled to the four bias transistors, the bias switching architecture being configured to alternately activate a first bias arrangement and a second bias arrangement using the first bias control signal, the second bias control signal, and the third bias control signal, wherein the first bias arrangement comprises the first bias transistor and the second bias transistor, and wherein the second bias arrangement comprises the third bias transistor and the fourth bias transistor.

* * * * *